(12) United States Patent
Butcher (10) Patent No.: US 8,068,559 B1
(45) Date of Patent: Nov. 29, 2011

(54) PULSE WIDTH MODULATION (PWM) CLOCK AND DATA RECEIVER AND METHOD FOR RECOVERING INFORMATION FROM RECEIVED DATA SIGNALS

(75) Inventor: James S. Butcher, Desert Hills, AZ (US)

(73) Assignee: ADTRAN, Inc., Huntsville, AL (US)

( * ) Notice: Subject to any disclaimer, the term of this patent is extended or adjusted under 35 U.S.C. 154(b) by 684 days.

(21) Appl. No.: 12/135,818

(22) Filed: Jun. 9, 2008

(51) Int. Cl.
*H03K 9/00* (2006.01)

(52) U.S. Cl. ........ 375/316; 375/354; 375/340; 375/343; 375/346; 375/344

(58) Field of Classification Search .................. 375/316, 375/354, 340, 343, 346, 344
See application file for complete search history.

(56) References Cited

U.S. PATENT DOCUMENTS

| | | | |
|---|---|---|---|
| 4,315,220 A | 2/1982 | Findeisen | |
| 4,373,140 A | 2/1983 | Chin | |
| 4,620,444 A | 11/1986 | Young | |
| 4,622,586 A | 11/1986 | Megeid | |
| 4,667,333 A | 5/1987 | Butcher | |
| 4,847,870 A | 7/1989 | Butcher | |
| 5,940,442 A | 8/1999 | Wong et al. | |
| 6,137,850 A | 10/2000 | Miller | |
| 6,438,178 B1 * | 8/2002 | Lysdal et al. | 375/317 |
| 6,472,861 B2 | 10/2002 | Chen et al. | |
| 6,751,745 B1 | 6/2004 | Yoshimura et al. | |
| 6,760,389 B1 | 7/2004 | Mukherjee et al. | |
| 7,091,793 B2 | 8/2006 | Bardsley et al. | |
| 7,120,216 B2 * | 10/2006 | Shirota et al. | 375/373 |
| 7,123,046 B2 | 10/2006 | Keeth | |
| 7,269,347 B1 * | 9/2007 | Matricardi et al. | 398/24 |
| 2002/0027688 A1 * | 3/2002 | Stephenson | 359/152 |
| 2003/0031282 A1 * | 2/2003 | McCormack et al. | 375/355 |
| 2006/0077850 A1 | 4/2006 | Umetani | |
| 2006/0091925 A1 * | 5/2006 | Desai et al. | 327/246 |
| 2009/0289683 A1 * | 11/2009 | Wong | 327/232 |

OTHER PUBLICATIONS

Dallas Maxim, "DS21348/DS21Q348 3.3V E1/T1/J1 Line Interface," Jan. 12, 2006, pp. 1-9, and 49.
Cirrus Logic, "CS61584A Dual T1/E1 Line Interface," Sep. 2005, pp. 1, and 18-19.

* cited by examiner

*Primary Examiner* — Kenneth Lam
(74) *Attorney, Agent, or Firm* — Lanier Ford Shaver & Payne, P.C.; Jon E. Holland (57) ABSTRACT

The present disclosure generally relates to pulse width modulation (PWM) clock and data receivers and methods for recovering data and timing information from received signals. A PWM clock and data receiver in one exemplary embodiment of the present disclosure has comparators for detecting pulses of a received data signal. The PWM clock and data receiver provides fixed frequency, variable duty cycle control signals that are used to control the biasing of the comparators to establish data decision levels for clock and data recovery. At times, the output of at least one comparator is used to perform peak detection, and the receiver controls the duty cycles of the control signals based on such peak detection in an effort to optimize the clock and data recovery process.

17 Claims, 5 Drawing Sheets

PULSE WIDTH MODULATION (PWM) CLOCK AND DATA RECEIVER AND METHOD FOR RECOVERING INFORMATION FROM RECEIVED DATA SIGNALS

RELATED ART

In conventional telecommunication systems, various types of integrated circuits (ICs) have been used to receive data signals and recover data and timing information from the received signals. However, many commercial ICs are often expensive and sometimes introduce undesirable clock jitter and wander. Further, a commercial IC is often designed to process a specific type or types of signals and may be incompatible with some signals communicated by conventional networks.

A discrete analog circuit having two data slicing comparators and a peak level detection comparator is sometimes employed in a conventional receiver. One of the data slicing comparators is used to detect positive pluses, and the other data slicing comparator is used to detect negative pulses. Further, the peak level detection comparator is used to detect the voltage peaks of the pulses so that the data slicing comparators can be properly biased, based on the peak voltage, to reduce errors in the decision process. Such a discrete circuit is typically manufactured at a lower cost and often introduces less jitter than many commercial ICs. However, it can be difficult to optimize the circuit for various types of timing signals.

Thus, a heretofore unaddressed need in the art exists for improved receiver circuitry capable of receiving data signals and recovering data and timing information from the received signals. It is generally desirable for such circuitry to be relatively inexpensive and to accommodate many types of data signals.

BRIEF DESCRIPTION OF THE DRAWINGS

The disclosure can be better understood with reference to the following drawings. The elements of the drawings are not necessarily to scale relative to each other, emphasis instead being placed upon clearly illustrating the principles of the disclosure. Furthermore, like reference numerals designate corresponding parts throughout the several views.

DETAILED DESCRIPTION

The present disclosure generally relates to pulse width modulation (PWM) clock and data receivers and methods for recovering data and timing information from received signals. A PWM clock and data receiver in one exemplary embodiment of the present disclosure has comparators for detecting pulses of a received data signal. The PWM clock and data receiver provides fixed frequency, variable duty cycle control signals that are used to control the biasing of the comparators to establish data decision levels for clock and data recovery. At times, the output of at least one comparator is used to perform peak detection, and the receiver controls the duty cycles of the control signals based on such peak detection in an effort to optimize the clock and data recovery process.

Figure 1:
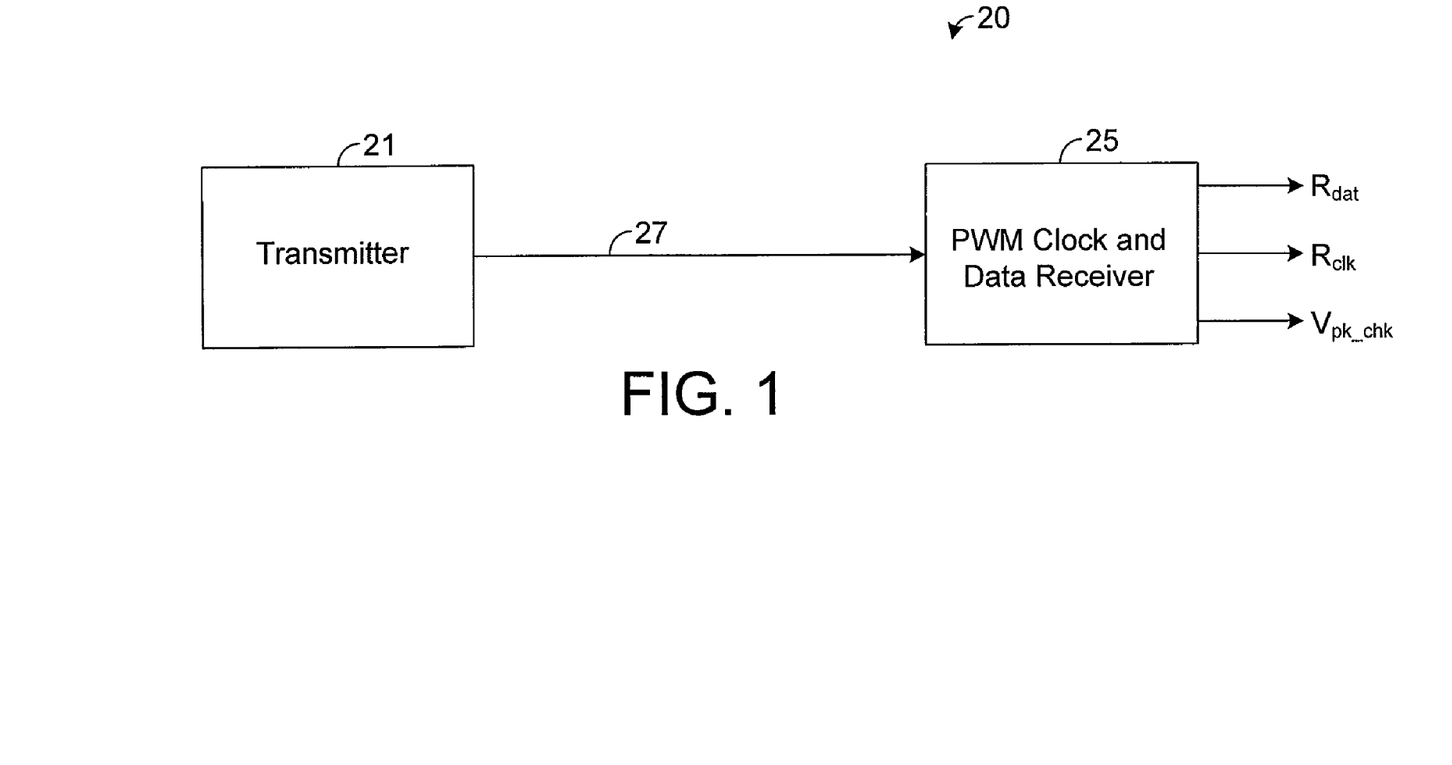
FIG. 1 is a block diagram illustrating an exemplary embodiment of a communication system in accordance with the present disclosure.

FIG. 1 depicts a communication system 20 having a transmitter 21 that transmits data signals to a PWM clock and data receiver 25 over a communication medium 27 coupled to the transmitter 21 and receiver 25. In one embodiment, the transmitter 21 is a Building Integrated Timing Supply (BITS) that provides multiple 1.544 mega-bits per second (Mbps) DS1 data timing signals to many receivers 25, all within one building. In another embodiment, the transmitter 21 is a Service Synchronization Unit (SSU) that provides 2.048 Mbps E1 data timing signals or 2.048 mega-Hertz (MHz) sine waves to many receivers 25, all within one building. The communication medium 27 comprises a pair of conductive wires twisted together and referred to as a "twisted pair" or a coaxial cable that comprises a single wire surrounded by a dielectric and a conductive shield. In other embodiments, other types of media and other data rates are possible.

In the BITS embodiment, the DS1 data timing signals carry timing information and may carry synchronization messages if the DS1 ESF framing format is used. The synchronization messages are sent continuously in the ESF data link bits and the PWM clock and data receiver 25 passes these messages to a downstream framing circuit that extracts them and validates a new message after about five seconds.

Figure 2:
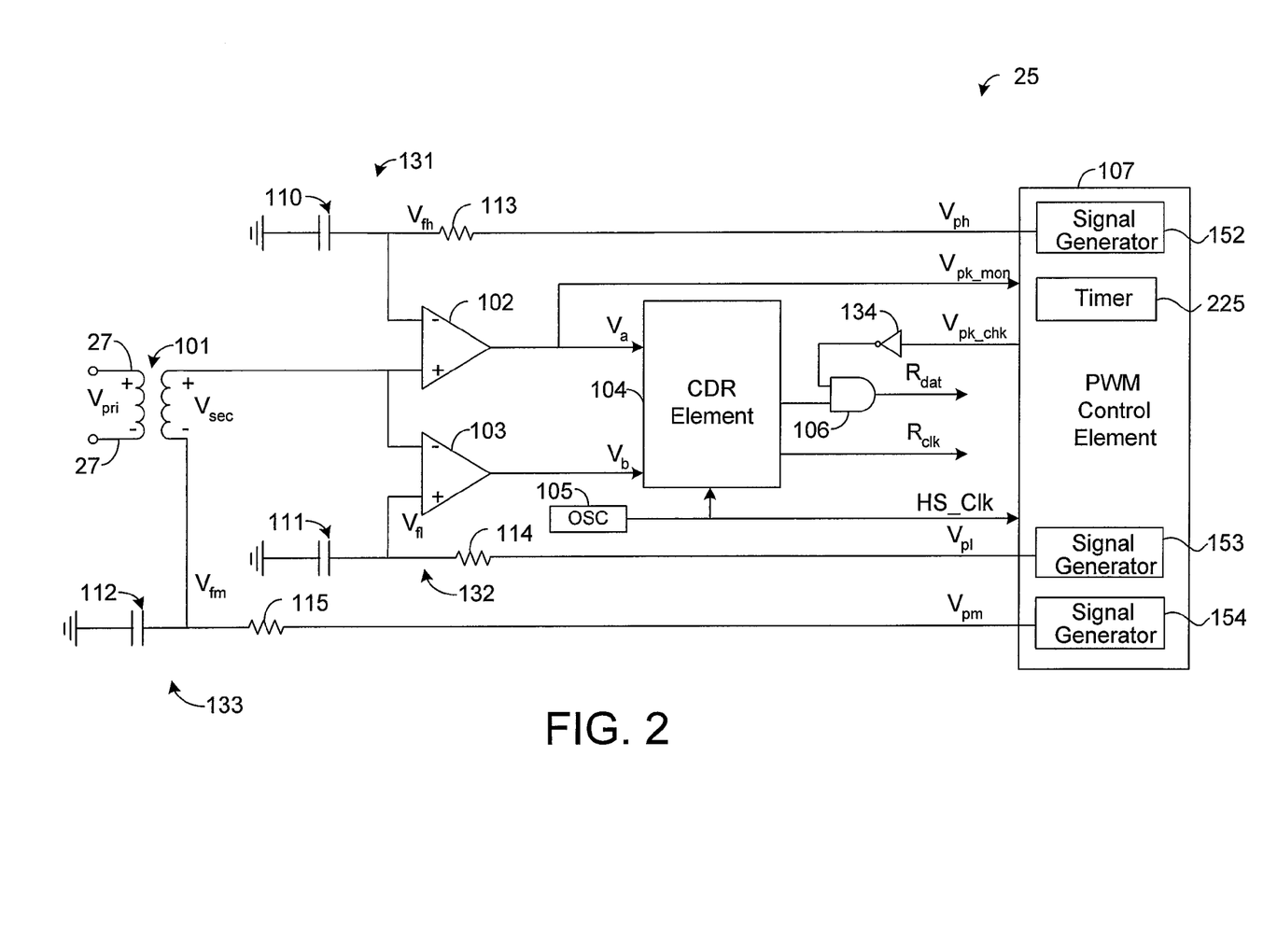
FIG. 2 is a block diagram illustrating an exemplary embodiment of a pulse width modulation (PWM) clock and data receiver, such as is depicted by FIG. 1.

FIG. 2 shows an exemplary embodiment of a PWM clock and data receiver 25. The receiver 25 has an isolation transformer 101 coupled to the communication medium 27. The receiver 25 also has a plurality of comparators 102, 103 coupled to the transformer 101. In particular, the comparator 102 has a positive input port (+) coupled to the transformer 101, and the comparator 103 has a negative input port (−) coupled to the transformer 101 and the positive input port of the comparator 102. As will be described in more detail hereafter, the comparator 102 is used to detect positive pulses of the data signal carried by the communication medium 27, and the comparator 103 is used to detect negative pulses of such data signals.

The negative input port of the comparator 102 is coupled to ground through a capacitor 110 and is coupled to a PWM control element 107 through a resistor 113. Further, the positive input port of the comparator 103 is coupled to ground through a capacitor 111 and to the PWM control element 107 through a resistor 114. The transformer 101 is also coupled to ground through a capacitor 112 and to the PWM control element 107 through a resistor 115.

Output ports of the comparators 102, 103 are coupled to a clock and data recovery (CDR) element 104, which is coupled to an oscillator (OSC) 105. The oscillator 105 provides a high speed clock signal (HS_Clk). The frequency of the clock signal from oscillator 105 is preferably higher than the frequency of the received data signal. For example, in one exemplary embodiment, the frequency of the clock signal (HS_Clk) from the oscillator 105 is 128 mega-Hertz (MHz), which is about 62 times the frequency of the receiver E1 data timing signal. However, in other embodiments, other frequencies for the clock signal (HS_Clk) and/or the received data signal are possible.

In one exemplary embodiment, the CDR element 104 is implemented as a field programmable gate array (FPGA). However, the CDR element 104 may be implemented in hardware, software, firmware, or any combination thereof. If any portion of the CDR element 104 is implemented in software or firmware, then the element 104 preferably comprises an instruction execution apparatus (not shown), such as a digital signal processor (DSP), for executing the instructions of the element 104.

Based on the output signal ($V_a$) of the comparator 102, the output signal ($V_b$) of the comparator 103, and the clock signal (HS_Clk) from the oscillator 105, the CDR element 104 is configured to recover digital data from the data signal carried by the communication medium 27 and to recover the clock signal ($R_{clk}$) originally used by the transmitter 21 to transmit such data signal. The recovered data passes through an AND gate 106, which also receives as input a signal ($V_{pk\_chk}$) through an inverter gate 134 from the PWM control element 107. Techniques for recovering a clock signal and digital data from a received data signal are generally well-known and will not be described in detail herein. The AND gate 106 outputs a signal ($R_{dat}$) defining the data recovered by the CDR element 104.

As will be described in more detail hereafter, the PWM control element 107 from time-to-time monitors the signal $V_a$, which is also referred to herein as $V_{pk\_mon}$, for detecting a voltage peak of this signal. While the PWM control element 107 is monitoring $V_{pk\_mon}$ for peak detection, the PWM control element 107 controls $V_{pk\_chk}$ such that $R_{dat}$ is forced to a logical low. That is, data recovery is effectively disabled during the periods that the PWM control element 107 is monitoring $V_{pk\_mon}$ for peak detection. During other time periods, the PWM control element 107 controls $V_{pk\_chk}$ such that the output of the AND gate 106 matches the output of the CDR element 104. That is, data recovery is enabled.

In one exemplary embodiment, the PWM control element 107 is implemented as a field programmable gate array (FPGA). However, the PWM control element 107 may be implemented in hardware, software, firmware, or any combination thereof. If any portion of the control element 107 is implemented in software or firmware, then the element 107 preferably comprises an instruction execution apparatus (not shown), such as a digital signal processor (DSP), for executing the instructions of the element 107.

The data signal carried by the communication medium 27 shall be referred to herein as an "input signal" ($V_{pri}$). The transformer 101 couples the input signal $V_{pri}$ to a signal ($V_{sec}$), which is monitored by the comparators 102, 103. The PWM control element 107 provides two fixed frequency, variable duty cycle control signals, $V_{ph}$ (V PWM high) and $V_{pl}$ (V PWM low), and a fixed frequency, fixed duty cycle control signal $V_{pm}$ (V PWM mid). In this regard, the PWM control element 107 has a signal generator 152 for generating $V_{ph}$ based on HS_Clk, and the PWM control element 107 has a signal generator 153 for generating $V_{pl}$ based on HS_Clk. The PWM control element 107 also has a signal generator 154 for generating $V_{pm}$ based on HS_Clk. In some embodiments, the duty cycle of $V_{pm}$ may be varied, if desired.

Digital-to-analog converters 131-133 convert $V_{ph}$, $V_{pl}$, and $V_{pm}$ to three direct current (DC) voltages $V_{fh}$, $V_{fl}$, and $V_{fm}$, respectively. In one embodiment, as shown by FIG. 2, each of the D/A converters 131-133 is implemented as a resistive-capacitive (RC) integrator. In this regard, capacitor 110 and resistor 113 form a RC integrator that converts $V_{ph}$ to a DC voltage, $V_{fh}$, and capacitor 111 and resistor 114 form a RC integrator that converts $V_{pl}$ to a DC voltage, $V_{fl}$. Further, capacitor 112 and resistor 115 form a RC integrator that converts $V_{pm}$ to a DC voltage, $V_{fm}$. In other embodiments, other types of digital-to-analog (D/A) converters may be used to convert $V_{ph}$, $V_{pl}$, and $V_{pm}$ to DC voltages. Indeed, any known D/A converter may be used to implement any of the converters 131-133.

The DC voltages control the biasing of the comparators 102, 103 to establish data decision levels that allow the CDR element 104 to accurately extract clock ($R_{clk}$) and data ($R_{dat}$). In particular, $V_{fh}$ and $V_{fm}$ control biasing of comparator 102, and $V_{fl}$ and $V_{fm}$ control biasing of comparator 103.

As described above, various known techniques for extracting $R_{clk}$ and $R_{dat}$ are possible. In one exemplary embodiment, the CDR element 104 extracts $R_{clk}$ only from the output ($V_b$) of comparator 103 and recovers $R_{dat}$ from an OR of the output ($V_a$ and $V_b$) of comparators 102, 103.

The PWM control element 107 controls the duty cycle of each of the digital signals $V_{ph}$, $V_{pm}$, and $V_{pl}$ via a respective PWM digital control word. Each of the foregoing signals switches between a logical low state and a logical high state at a fixed PWM frequency and with a controllable duty cycle that determines the DC voltage level after D/A conversion. The resolution of the PWM-to-DC conversion is determined by the PWM period and the clock frequency used to increment and decrement the duty cycle. The PWM frequency is preferably high enough to cause very little ripple in the filtered analog voltages when the duty cycle is constant.

The $V_{pm}$ duty cycle is fixed at about 50% to generate a $V_{fm}$ (filtered mid) voltage of one-half the supply voltage ($V_{cc}$) from a power source (not specifically shown), which powers the components of the receiver 25 and, in particular, the comparators 102, 103. This biases the transformer secondary output ($V_{sec}$) at the center of the supply voltage to be in the input common mode range of comparators 102, 103. The $V_{ph}$ duty cycle ranges from about 50% to 100% to generate a $V_{fh}$ (filtered high) voltage that ranges from about ½ $V_{cc}$ to $V_{cc}$. The $V_{fh}$ voltage is the data slicing decision level for positive data pulses. The $V_{pl}$ duty cycle ranges from about 50% to 0% to generate a $V_{fl}$ (filtered low) voltage that ranges from about ½ $V_{cc}$ to 0 Volts (V). The $V_{fl}$ voltage is the data slicing decision level for negative data pulses. Other duty cycle percentages are possible in other embodiments.

Figure 3:
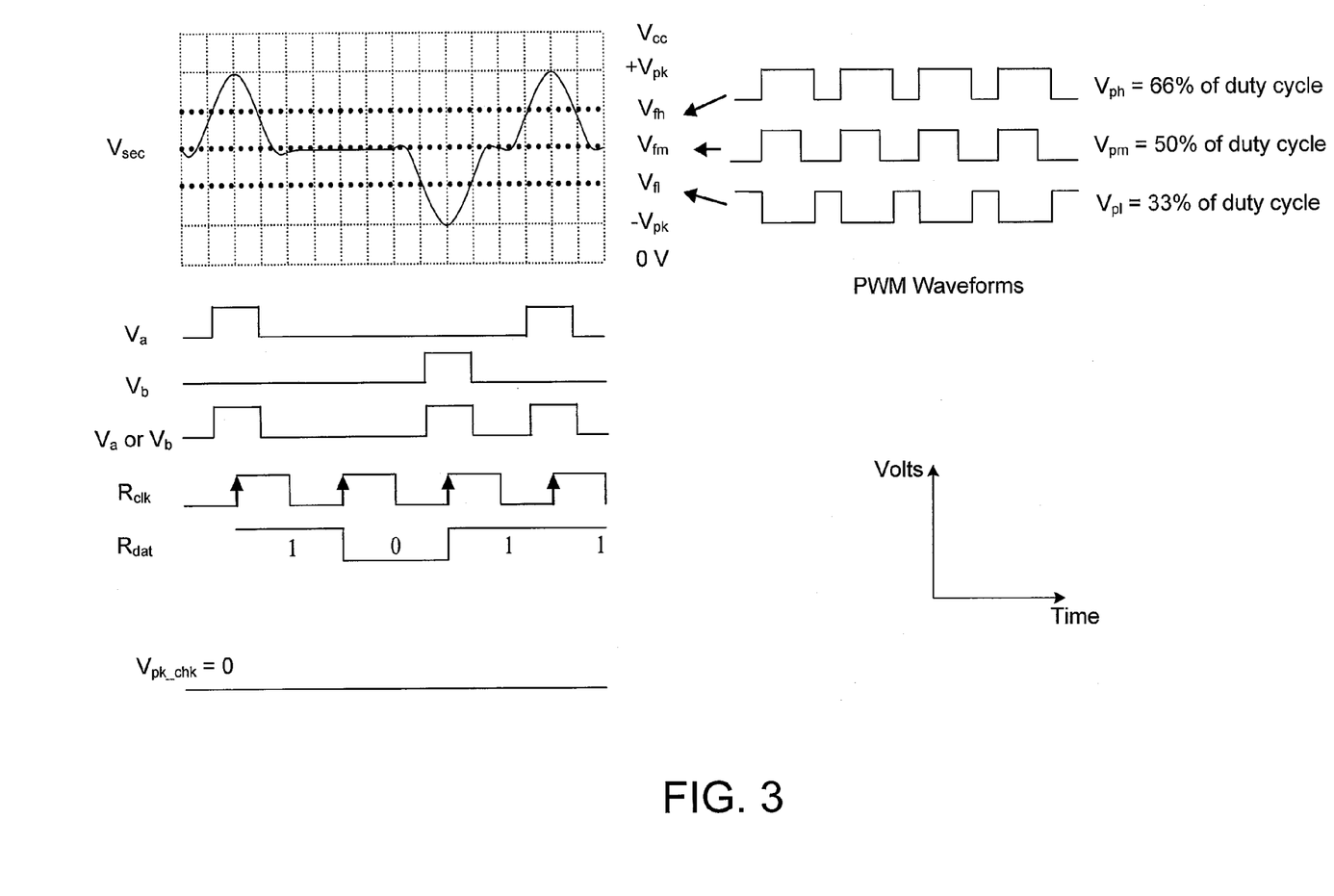
FIG. 3 is an exemplary timing diagram for signals processed by a PWM clock and data receiver, such as is depicted by FIG. 2.

FIG. 3 depicts exemplary waveforms associated with the receiver 25 shown by FIG. 2 for an E1 data input signal while $V_{pk\_chk}$ is equal to 0. The $V_{sec}$ waveform is four bits (1011) of a bipolar AMI E1 data signal. The positive peak voltage of this signal is +$V_{pk}$ and the negative peak voltage is -$V_{pk}$. The signal is biased at one-half the supply voltage ($V_{cc}$), which is equal to $V_{fm}$. The $V_{fh}$ and $V_{fl}$ voltages are the positive and negative pulse decision levels for the comparators 102, 103 (+/-50% of $V_{pk}$). In this regard, comparator 102 outputs a logical high value, if $V_{sec}$ exceeds $V_{fh}$, and otherwise outputs a logical low value, thereby providing samples of positive pulses of $V_{sec}$. Comparator 103 outputs a logical high value, if $V_{sec}$ is less than $V_{fl}$, and otherwise outputs a logical low value thereby providing samples of negative pulses of $V_{sec}$.

In the example shown by FIG. 3, the $V_{fh}$, $V_{fm}$, and $V_{fl}$ DC voltages are derived from 66%, 50% and 33% duty cycle waveforms $V_{ph}$, $V_{pm}$, and $V_{pl}$ by D/A converters 131-133, which are implemented as RC filters in FIG. 2. The $V_a$ and $V_b$ outputs of comparators 102, 103 are ORed by the CDR element 104 and center sampled by $R_{clk}$ in the CDR element 104 to provide $R_{dat}$. In one exemplary embodiment, $V_{sec}$ is an E1 signal, and a 2.048 Mega-Hertz (MHz) $R_{clk}$ is derived using a digital phase lock loop in the CDR element 104 that locks to the transitions of $V_b$. Since $R_{clk}$ is derived from the clock signal (HS_Clk), the minimum phase jitter of $R_{clk}$ is determined by the period of HS_Clk.

Figure 4:
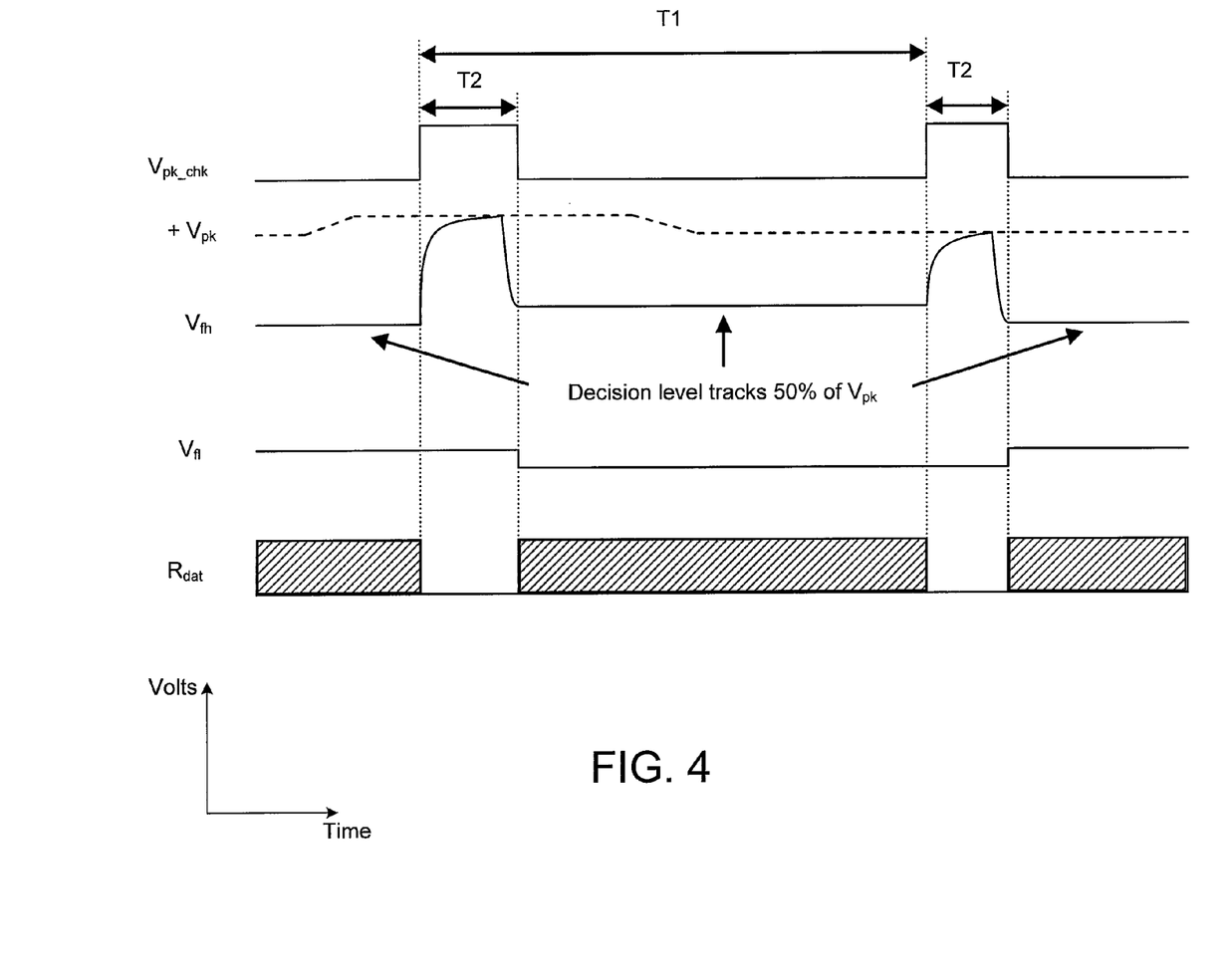
FIG. 4 is an exemplary timing diagram for signals processed by a PWM clock and data receiver, such as is depicted by FIG. 2.

Referring to FIG. 4, every T1 seconds, $V_{pk\_chk}$ transitions to a logical high for T2 seconds and the $V_{fh}$ voltage changes so that the PWM control element 107 can find the peak level of the positive pulses. During this short peak level detection period T2, data reception is inhibited by AND gate 106 and inverter gate 134 since $V_{pk\_chk}$ forces $R_{dat}$ to 0. However timing recovery on the negative pulse data edges continues to occur since the output ($V_b$) of comparator 103 is valid and, therefore, $R_{clk}$ remains valid. Note that, in FIG. 4, the cross-hatched regions for $R_{dat}$ indicates the period when data recovery is enabled so that $R_{dat}$ may fluctuate between logical high values and logical low values depending on the data of $V_{sec}$.

Peak level detection can be performed by slowly increasing the $V_{fh}$ voltage until no data activity is detected at the output ($V_{pk\_mon}$) of comparator 102. When not in a peak level detection period, the $V_{fh}$ and $V_{fl}$ voltages are fixed relative to the $V_{fm}$ voltage at +50% and −50% of the $V_{pk}$ voltage measured during the previous peak level detection period. $V_{fl}$ tracks $V_{fh}$ so that $V_{fh}-V_{fm}=V_{fm}-V_{fl}$ providing symmetrical positive and negative comparator decision levels centered at $V_{fm}$.

The receiver 25 can be used to receive various types of signals, including but not limited to sine or square waves. For example, the receiver 25 can receive DS1, E1, or signals in accordance with other known protocols. When receiving sine or square waves, the comparator 103 may receive the clock with a zero input offset decision level that slices the sine or square wave at the zero crossing, which is generally ideal for receiving low amplitude signals. This can be achieved by making $V_{pl}$ equal to $V_{pm}$, which is ideally at a 50% duty cycle. In such an embodiment, the CDR element 104 passes the output ($V_b$) of comparator 103 directly to the $R_{clk}$ output. Comparator 102 can serve as a loss of signal detector by setting the decision level $V_{fh}$ at a threshold that is slightly below the peak of the lowest expected valid signal. Loss of pulses at the output of comparator 102 indicates a loss of signal.

In one exemplary embodiment, low duty cycle pulse signals, like one pulse per second (PPS) from a GPS receiver, can also be received by setting the decision level ($V_{fl}$) to 50% of the minimum expected pulse peak, although other percentages can be used. A fixed decision level is generally adequate to reliably receive a 1 PPS signal if the cable length is short. Peak detection of a 1 PPS signal can be done, however, if the receiver 25 is to work over a range of signal levels and cable lengths. Comparator 102 is available to continuously look for the peak voltage, which could be measured over many pulse periods. The comparator 103 decision level ($V_{fl}$) could be adjusted to a percentage of the measured peak voltage (e.g., 50%).

Note that the comparator decision level voltages $V_{fh}$, $V_{fm}$, and $V_{fl}$ can be derived from matched PWM digital output buffers on the same integrated circuit (IC), providing very precise duty cycle control. The same duty cycle on all three signals produces three filtered DC voltages that match within millivolts. This voltage matching can be maintained even with large power supply voltage variations and large differences in each RC time constant. This accurate voltage matching allows accurate clock and data recovery from a very small amplitude input signal.

In embodiments described above, the comparator 102 is described as being used for both data recovery and peak detection. However, in other embodiments, other configurations are possible. For example, it is possible to include a third comparator (not shown) and use the third comparator for peak detection while using comparator 102 for data recovery only. This allows continuous data recovery which is required in many communication applications. However, such an embodiment increases the number of components of the receiver 25 and, therefore, potentially increases the receiver's cost.

An exemplary operation of the receiver 25 will be described hereafter with particular reference to FIG. 5.

For illustrative purposes, assume that the receiver 25 operates on a supply voltage ($V_{cc}$) of 5 Volts (V). Further assume that the PWM control element 107 defines an eight-bit digital word for each of the PWM signals $V_{ph}$, $V_{pl}$, and $V_{pm}$. In particular, the PWM control element 107 defines an eight-bit digital word, referred to hereafter as "$V_{ph}$ Word," for controlling the duty cycle of $V_{ph}$, and the PWM control element 107 defines an eight bit digital word, referred to hereafter as "$V_{pl}$ Word," for controlling the duty cycle of $V_{pl}$. In addition, the PWM control element 107 defines an eight-bit digital word, referred to hereafter as "$V_{pm}$ Word," for controlling the duty cycle of $V_{pm}$.

Each of the foregoing digital words is derived from an eight-bit word, referred to as "$V_{pk}$ Word," indicating the peak voltage of the received data signal. In this regard, $V_{pk}$ Word represents the duty cycle for $V_{ph}$ that results in a DC voltage ($V_{fh}$) that is equal to the voltage peak of the input data signal $V_{sec}$. In other embodiments, words having other bit lengths may be used.

Further, since $V_{pk}$ Word, $V_{ph}$ Word, $V_{pl}$ Word, and $V_{pm}$ Word are eight bits each, there are 256 duty cycle levels indicated by each of these words. In this regard, the binary value 00000000 represents the 0% duty cycle, and the binary value 11111111 represents the 100% duty cycle. Further, the duty cycle varies linearly from 00000000 to 11111111.

As described above, in one exemplary embodiment, the duty cycle of $V_{pm}$ is fixed at 50%. Thus, the control element 107 sets the value of $V_{pm}$ Word to 128 (i.e., binary value 10000000) and transmits this word to the signal generator 154. The generator 154 transmits a digital signal ($V_{pm}$) based on HS_Clk. In one exemplary embodiment, $V_{pm}$ has ½56 the frequency of HS_Clk, but it is possible for $V_{pm}$ to have a different frequency. Further, the signal generator 154 controls $V_{pm}$ such that it has the duty cycle indicated by the $V_{pm}$ Word. In the instant case, the generator 154 controls $V_{pm}$ such that it has a fixed 50% duty cycle thereby establishing the 0 level of the data signal at the midpoint of the voltage range provided by the supply voltage.

Figure 5:
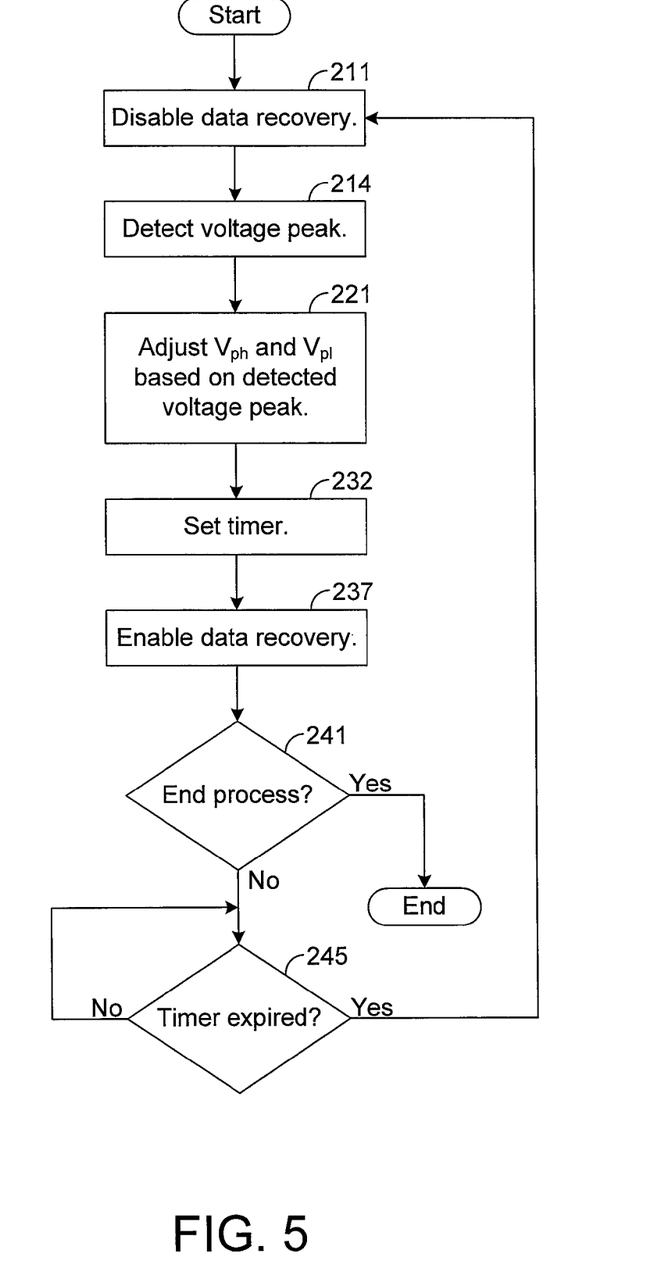
FIG. 5 is a flow chart illustrating an exemplary process for providing pulse width modulation (PWM) control signals for a PWM clock and data receiver, such as is depicted by FIG. 2.

Initially, the PWM control element 107 disables data recovery and detects the peak voltage of the incoming data signal, $V_{sec}$, as shown by blocks 211 and 214 of FIG. 5. In this regard, to disable data recovery, the control element 107 transmits a logical high value for $V_{pk\_chk}$ such that the output of the AND gate 106 is forced to a logical low value regardless of the output of the CDR element 104. Various techniques may be used to detect the voltage peak of $V_{sec}$ in block 214.

In one exemplary embodiment, the control element 107 sets the duty cycle of $V_{ph}$ such that $V_{fh}$ is below the expected peak voltage of $V_{sec}$, and the element 107 then monitors $V_{pk\_mon}$ for a predefined time period for activity. If $V_{pk\_mon}$ transitions during the predefined time period, then the PWM control element 107 determines that there is activity and that the peak voltage is higher than the current voltage of $V_{fh}$. Thus, the control element 107 increments the value of $V_{ph}$, thereby slightly increasing the duty cycle of $V_{ph}$ and, hence, the voltage of $V_{fh}$, and the element 107 again monitors $V_{pk\_mon}$ for activity for another predefined time period. The control element 107 continues incrementing $V_{ph}$ and checking $V_{pk\_mon}$ for activity until a voltage for $V_{fh}$ is reached such that there is no activity detected on $V_{pk\_mon}$. At this point, the control element 107 sets $V_{pk}$ Word equal to the duty cycle of $V_{ph}$. That is, $V_{pk}$ Word is set such that, if $V_{ph}$ has the duty cycle indicated by $V_{pk}$ Word, then $V_{fh}$ should have a voltage equal to the peak voltage of $V_{sec}$.

Note that, in the process described above, $V_{ph}$ is adjusted in order to detect the peak voltage of $V_{sec}$. Disabling of data recovery during such time periods, as described above, helps to prevent data errors that otherwise could result from the adjustments to $V_{ph}$ during the peak check when the same comparator 102 is used for data recovery and peak detection.

After determining $V_{pk}$ Word, the PWM control element 107 translates $V_{pk}$ Word into the $V_{pl}$ Word and the $V_{ph}$ Word. With respect to the $V_{ph}$ Word, the PWM control element 107 translates the $V_{pk}$ Word such that the $V_{ph}$ Word represents the appropriate duty cycle of $V_{ph}$ for establishing the decision level for positive pulses to be the approximate midpoint between the zero voltage level and the positive peak voltage of $V_{sec}$.

As an example, assume that the $V_{pk}$ Word has a value of 250. Noting that the zero level is at 128, the control element 107 assigns the $V_{ph}$ Word a value about halfway between the zero level (i.e., 128) and the peak value of 250. Thus, in the instant example, the control element 107 assigns the $V_{ph}$ Word a value of 189, which represents a duty cycle of about 74%. The control element 107 provides the $V_{ph}$ Word to the signal generator 152, which controls the duty cycle of $V_{ph}$ to match that indicated by the $V_{ph}$ Word. In this regard, the signal generator 152 repetitively transmits the value of the $V_{ph}$ word at $1/256$ the frequency of HS_Clk such that the DC voltage of $V_{fh}$ is about 74% of $V_{cc}$. The D/A converter 131 formed by resistor 113 and capacitor 110 converts the digital signal $V_{ph}$ to analog thereby establishing the decision level for data recovery at the approximate midpoint between the zero level established by $V_{pm}$, which is about 50% of $V_{cc}$, and the positive peak voltage of $V_{sec}$.

Based on the $V_{pk}$ Word, the control element 107 establishes the duty cycle for $V_{pl}$ such that the absolute value of the difference between the duty cycles of $V_{pl}$ and $V_{pm}$ is equal to the absolute value of the difference between the duty cycles of $V_{ph}$ and $V_{pm}$. In this regard, it is assumed that $V_{sec}$ is symmetrical about $V_{fm}$, and the decision level for negative pulses is set accordingly. Thus, in the instant example in which the $V_{ph}$ Word is assigned a value of 189, the control element 107 assigns the $V_{pl}$ Word a value of 67, which represents a duty cycle of about 26%. The control element 107 provides the $V_{pl}$ Word to the signal generator 153, which controls the duty cycle of $V_{pl}$ to match that indicated by the $V_{pl}$ Word. In this regard, the signal generator 153 repetitively transmits the value of the $V_{pl}$ Word at $1/256$ the frequency of HS_Clk such that the DC voltage of $V_{fl}$ is about 26% of $V_{cc}$. The D/A converter 132 formed by resistor 114 and capacitor 111 converts the digital signal $V_{pl}$ to analog thereby establishing the decision level for data recovery at the approximate midpoint between the zero level established by $V_{pm}$ and the negative peak voltage of $V_{sec}$.

Moreover, according to the techniques described above, the PWM control element 107 appropriately adjusts $V_{ph}$ and $V_{pl}$ based on the detected peak voltage, as indicated by block 221 of FIG. 5. As shown by FIG. 2, the PWM control element 107 has a timer 225. In block 232, the PWM control element 107 sets the timer 225 to expire within a specified time period, such as a time period between about 2 to 5 seconds, although other durations for the timer 225 are possible. As shown by block 237, the PWM control element 107 enables data recovery by transitioning $V_{pk\_chk}$ to a logical low value such that the output of the CDR element 104 controls the output ($R_{dat}$) of the AND gate 106.

If the receiver 25 is to stop receiving data (e.g., if the receiver 25 receives an input indicating that it is to reset or shut down), then the control element 107 makes a "yes" determination in block 241, and the process shown by FIG. 5 ends. Otherwise, the CDR element 104 extracts data and timing from $V_{sec}$ based on the samples provided by comparators 102, 103 until expiration of the timer 225. When the timer 225 expires, the element 107 makes a "yes" determination in block 245 and then temporarily disables data recovery so that the element 107 can again check the voltage peak of $V_{sec}$ (referred to hereafter as perform a "peak check") and adjust $V_{ph}$ and $V_{pl}$ to account for any change in the peak voltage of $V_{sec}$ since the previous peak check. Accordingly, if the peak voltage drifts, the element 107 periodically adjusts $V_{ph}$ and $V_{pl}$ to account for the drift.

Note that the duration of a peak check (i.e., the time used for detecting the voltage peak of $V_{sec}$) can be relatively small (e.g., on the order of a hundred milliseconds or so) compared to the time between peak checks. Thus, the peak checks overall do not have a significant effect on data recovery, when the data is repetitively sent such as for DS1 ESF data link messages. In addition, the timing recovery based on comparator 103 continues during a peak check, which is based on the output of comparator 102.

Note that the time utilized for performing a peak check may be reduced by using information obtained from a previous peak check. In this regard, once the $V_{pk}$ Word is determined while performing a peak check, the $V_{pk}$ Word is stored by the PWM control element 107 for use in performing the next successive peak check. As indicated above, $V_{pk}$ Word indicates the peak voltage level detected by the control element 107 during a peak check. In performing the next successive peak check, the element 107 retrieves $V_{pk}$ Word from the previous peak check and subtracts a predefined value (e.g., ten) from the $V_{pk}$ Word and uses this value as a starting point for the duty cycle of $V_{ph}$ and, hence, the voltage level of $V_{fh}$. In this regard, the predefined value subtracted from $V_{pk}$ Word is selected so that it is likely that, by setting the duty cycle of $V_{ph}$ equal to the difference, the voltage of $V_{fh}$ is just below the peak voltage $V_{sec}$, assuming that there has not been significant drift of the peak voltage of $V_{sec}$ since the last peak check. Thus, if the peak voltage of $V_{sec}$ has not significantly changed, then it is likely that the peak voltage will be detected in a relatively short time period. In this regard, as described above, $V_{ph}$ is incremented if there is activity sensed for $V_{pk\_mon}$ at the current voltage of $V_{fh}$. If the initial value of $V_{fh}$ is just below the actual peak value of $V_{sec}$, then a small number of steps would occur before the peak voltage is detected. Thus, using the $V_{pk}$ Word determined for a previous peak check may help to reduce the duration of the current peak check.

If the peak voltage of $V_{sec}$ changes significantly such that the initial value of $V_{fh}$ for a peak check is above the peak voltage of $V_{sec}$, then no activity will be sensed for the initial value of $V_{fh}$. In such a case, the control element 107 may be configured to lower the voltage of $V_{fh}$ and restart the peak check. Indeed, the control element 107 may continue lowering $V_{fh}$ until activity is sensed for $V_{pk\_mon}$. If no activity is still sensed after $V_{fh}$ has been lowered beyond a predefined level, then the control element 107 determines that data signal has been lost. In response to such an event, the element 107 may be configured to perform various actions, such as transmitting a loss of signal notification so that a user of the receiver 25 is aware of the problem.

Now, therefore, the following is claimed:

1. A pulse width modulation (PWM) clock and data receiver, comprising:
   a first digital-to-analog (D/A) converter;
   a second D/A converter;
   a third D/A converter coupled to a transformer;
   a first comparator having a first input port, a second input port, and a first output port, the first input port coupled to the transformer and the second input port coupled to the first D/A converter;
   a second comparator having a third input port, a fourth input port, and a second output port, the third input port coupled to the transformer and the fourth input port coupled to the second D/A converter;
   a clock and data recovery (CDR) element coupled to the first and second output ports, the CDR element configured to recover, based on the first and second comparators, digital data and a clock signal from a data signal received via the transformer; and
   a PWM control element configured to transmit a first PWM control signal to the first D/A converter, a second PWM control signal to the second D/A converter, and a third PWM control signal to the third D/A converter, wherein the first D/A converter is configured to convert the first PWM control signal into a first direct current (DC) voltage for biasing the first comparator, wherein the second D/A converter is configured to convert the second PWM control signal into a second DC voltage for biasing the second comparator, and wherein the third D/A converter is configured to convert the third PWM control signal into a third DC voltage for biasing of the first and second comparators.

2. The PWM clock and data receiver of claim 1, wherein each of the D/A converters comprises a resistor and a capacitor.

3. The PWM clock and data receiver of claim 1, wherein the first and second PWM control signals have variable duty cycles, and wherein the third PWM control signal has a fixed duty cycle.

4. The PWM clock and data receiver of claim 1, wherein the PWM control element is configured to detect a peak voltage for the data signal, and wherein the PWM control element is configured to establish a duty cycle for the first PWM control signal based on the detected peak voltage and to establish a duty cycle for the second PWM control signal based on the detected peak voltage.

5. The PWM clock and data receiver of claim 4, wherein first and second PWM control signals have variable duty cycles, and wherein the third PWM control signal has a fixed duty cycle.

6. The PWM clock and data receiver of claim 4, wherein the PWM control element is configured to receive a signal output by the first comparator and to detect the peak voltage based on the signal output by the first comparator.

7. The PWM clock and data receiver of claim 4, wherein the PWM control element is configured to temporarily disable data recovery from the data signal for a time period and to detect the peak voltage during the time period while the data recovery is disabled.

8. A pulse width modulation (PWM) clock and data receiver, comprising:
   a first comparator configured to receive a data signal;
   a second comparator configured to receive the data signal;
   a clock and data recovery element configured to recover, based on the first and second comparators, digital data and a clock signal from the data signal; and
   a PWM control element configured to provide a first PWM control signal for controlling biasing of the first comparator, a second PWM control signal for controlling biasing of the second comparator, and a third PWM control signal for controlling biasing of the first and second comparators, wherein the PWM control element is configured to detect a peak voltage for the data signal, and wherein the PWM control element is configured to establish a duty cycle for the first PWM control signal based on the detected peak voltage and to establish a duty cycle for the second PWM control signal based on the detected peak voltage.

9. The PWM clock and data receiver of claim 8, wherein first and second PWM control signals have variable duty cycles, and wherein the third PWM control signal has a fixed duty cycle.

10. The PWM clock and data receiver of claim 8, wherein the PWM control element is configured to receive a signal transmitted by the first comparator and to detect the peak voltage based on the signal transmitted by the first comparator.

11. The PWM clock and data receiver of claim 8, wherein the PWM control element is configured to temporarily disable data recovery from the data signal for a time period and to detect the peak voltage during the time period while the data recovery is disabled.

12. A pulse width modulation (PWM) clock and data receiver, comprising:
   a first comparator configured to receive a data signal;
   a second comparator configured to receive the data signal;
   a clock and data recovery element configured to recover, based on the first and second comparators, digital data and a clock signal from the data signal; and
   a PWM control element configured to provide a first PWM control signal for controlling biasing of the first comparator, a second PWM control signal for controlling biasing of the second comparator, and a third PWM control signal for controlling biasing of the first and second comparators;
   a first digital-to-analog (D/A) converter;
   a second D/A converter; and
   a third D/A converter,
   wherein the first comparator has a first input port, a second input port, and a first output port, the first input port coupled to a transformer and the second input port coupled to the first D/A converter, wherein the second comparator has a third input port, a fourth input port, and a second output port, the third input port coupled to the transformer and the fourth input port coupled to the second D/A converter, and wherein the clock and data recovery element is coupled to the first and second output ports.

13. A method for receiving data signals, comprising the steps of:
   receiving a data signal;
   sampling positive pulses of the data signal via a first comparator;
   sampling negative pulses of the data signal via a second comparator;
   recovering digital data and a clock signal from the data signal based on the sampling steps;
   detecting peak voltages for the data signal;
   transmitting a first pulse width modulation (PWM) control signal having a duty cycle based on at least one of the detected peak voltages;
   transmitting a second PWM control signal having a duty cycle based on at least one of the detected peak voltages;

transmitting a third PWM control signal;
controlling biasing of the first comparator based on the first PWM control signal and the third PWM control signal; and
controlling biasing of the second comparator based on the second PWM control signal and the third PWM control signal.

14. The method of claim 13, wherein the detecting step is based on one of the comparators.

15. The method of claim 14, further comprising the step of temporarily disabling recovery of the digital data based on the detecting step.

16. The method of claim 13, further comprising the steps of:

detecting a new voltage peak for the data signal; and updating the duty cycle of the first PWM control signal based on the detected new voltage peak.

17. The method of claim 13, wherein the third PWM has a fixed duty cycle.

\* \* \* \* \*